United States Patent
Kroneder et al.

(10) Patent No.: US 7,396,261 B2
(45) Date of Patent: Jul. 8, 2008

(54) CONTACT MAKER FOR POWER SEMICONDUCTOR MODULES AND DISC CELLS

(75) Inventors: Christian Kroneder, Schwanstetten (DE); Björn Tauscher, Abenberg (DE)

(73) Assignee: Semikron Elektronik GmbH & Co., KG, Nuremberg (DE)

( * ) Notice: Subject to any disclaimer, the term of this patent is extended or adjusted under 35 U.S.C. 154(b) by 464 days.

(21) Appl. No.: 11/252,338

(22) Filed: Oct. 17, 2005

(65) Prior Publication Data

US 2006/0154527 A1 Jul. 13, 2006

(30) Foreign Application Priority Data

Oct. 16, 2004 (DE) .................... 10 2004 050 588

(51) Int. Cl.
*H01R 13/24* (2006.01)
*H01R 4/48* (2006.01)
(52) U.S. Cl. ..................... 439/700; 439/824
(58) Field of Classification Search ............... 439/700, 439/625, 824, 562
See application file for complete search history.

(56) References Cited

U.S. PATENT DOCUMENTS 5,631,959 A * 5/1997 Messina et al. ........ 379/428.01
6,155,846 A * 12/2000 Yeoh et al. ................. 439/482
6,923,690 B1 * 8/2005 Wang ........................ 439/824
7,134,878 B2 * 11/2006 Zheng et al. ............... 439/700
7,331,805 B1 * 2/2008 Hu ............................ 439/188

FOREIGN PATENT DOCUMENTS

DE 196 51 632 6/1996

OTHER PUBLICATIONS

K. Heumann, "*Principles of Power Electronics*" Stuttgart: Teubner, 1996 (ISBN 3-519-06110-4), 6th Edition.

* cited by examiner

*Primary Examiner*—Briggitte R Hammond
(74) *Attorney, Agent, or Firm*—Lackenbach Siegel, LLP; Andrew F. Young, Esq.

(57) ABSTRACT

The present invention relates to a contact maker for the gate terminal of power semiconductor components in disc cells and power semiconductor modules. Disposed above the power semiconductor component is a shaped member that incorporates in the region of the gate terminal a recess, and this recess, in turn, also incorporates a counter-support. The contact maker consists of a contact spring incorporating a pin-like extension at the end of the spring that contacts the gate terminal, and incorporating a connection created via a shaped metal element to a connecting cable for the external connection at the other end of the spring, and of an insulating sleeve with a contact spring disposed therein. The insulating sleeve itself has at least one locking projection, which, together with the counter-support of the shaped member, forms a snap-lock connection.

20 Claims, 3 Drawing Sheets

CONTACT MAKER FOR POWER SEMICONDUCTOR MODULES AND DISC CELLS

CROSS REFERENCE TO RELATED APPLICATIONS

This application claims priority to German Application No. DE 10 2004 050 588.8, filed Oct. 16, 2004, the contents of which are herein incorporated fully by reference.

BACKGROUND OF THE INVENTION

1. Field of the Invention

The present invention relates to a supporting sleeve for leg or arm stumps, namely a liner. More specifically, the present invention relates to a liner for surrounding a stump from its distal end with an elastic electrically insulating material, wherein the sleeve has at least partially a layer of a conductive material.

2. Description of the Related Art

The present invention involves a contact maker for the gate terminal of power semiconductor components in disc cells and power semiconductor modules.

The related art involves basic contact makers as a component of disc cells, as they are known, for example, from Heumann, "Grundlagen der Leistungselektronik" ["Fundamentals of Electronic Power"], Teubner Verlag, 6th edition, ISBN 3-519-06110-4, see page 37, and of preferably pressure-contacted power semiconductor modules, as they are known, for example, from DE 196 51 632 A1.

Pressure-contacted power semiconductor modules such as, for example, those according to DE 196 51 632 A1, are suitable for very high performance requirements regarding current-carrying capacity and reliability. This is why the gate terminal plays an equally important role here as the power terminals.

Pressure-type contacts of power terminals are sufficiently known as a tried and tested connecting technology from the production of semiconductor modules.

Unfortunately, for the contact of gate terminals, on the other hand, a great number of variations exist with different degrees of production complexity and different degrees of reliability not directly related to the former.

Soldered connections involving gate terminals and semiconductor components are known. Also known are different types of spring-biased pressure contacts, which have in common that they require a complex production that is unfortunately only manually possible and are substantially unreliable due to human error and other factors common in manufacturing.

Referring now to FIG. 1, a partial section through a disc cell 950 according to the conventional art is known. Disc cell 950 has an insulating member 954, preferably made of ceramic material. This insulating member 954 forms the housing of disc cell 950, and its top and bottom covers 956, 952 are implemented as shaped metal members. Disposed in the interior of disc cell 950 is a power semiconductor component 600.

In this conventional embodiment of disc cell 950, one of the shaped metal members 956 incorporates a recess 958. Disposed in recess 958 is the gate contact maker. It is implemented as an elastic wire element 962 with an insulating sleeve. The insulation covers only the portion of the wire element 962 that can come into contact with shaped metal member 956. The first end of the wire element 962 is arranged in a recess of insulating member 956 that is provided with a metal sleeve 964, and it is thus connected to it in an electrically conducting manner. The second end 960 of wire element 962 sits on the gate terminal of power semiconductor component 600. The arrangement in metal sleeve 964 and the shape of wire element 962 produce an elastic effect with an application of force on second end 960 of wire element 962 in the direction of power semiconductor component 600.

As shown, conventional disc cell 950 has the shortcoming that shaped metal member 956 must have a radially outwardly extending recess 958 to receive wire element 962. As a consequence, this design cannot be manufactured in a cost effective manner, and it is also not possible to automate the assembly of the contact maker.

Referring now to FIG. 2, a section through a conventional embodiment of a pressure-contacted power semiconductor module 900 is shown. Here, a metallic base plate 902, a plastic housing 908, and a plastic cover 910 are provided. Disposed on base plate 902, following an insulating layer, is a first shaped metal member 904, disposed on which is a power semiconductor component 600, and above same a second shaped metallic member 908. Second shaped metallic member 908 is placed under pressure by means of a pressure-contacting device 906 and thus pushes semiconductor component 600 against first shaped member 904 and the same against the base plate 902. In this manner a reliable electrical contact of semiconductor component 600 to the two shaped members 904, 908 is laboriously ensured, as well as a minimal thermal contact to base plate 902. The two shaped metallic members 904, 908 thus serve to contact the main terminals.

Gate terminal 610 of power semiconductor component 600 is contacted by means of a contact maker. This contact maker consists of a metallic wire element 914, which is fixed in a retaining means 912 of the housing. Provided, extending from this retaining means 912, is an electrically isolated wire connection 916 to an external connection. The second shaped metallic member 908 has a recess 920, in which wire element 914 is arranged and contacts gate terminal 610. Wire element 914, as well as its retaining element 912 are designed in such a way that wire element 914 establishes a spring force that is directed toward power semiconductor component 600. The gate terminal of power semiconductor module 900 is thus executed in pressure-contact technology as well.

This embodiment of the contact maker does have the shortcoming, however, that because of the recess 920 in second shaped member 908, the application of pressure on the power semiconductor component 600 does not take place in a radially symmetrical manner. An additional shortcoming is that the contact makers are implemented differently for different power classes of power semiconductor module 900 and corresponding different diameters of power semiconductor component 600. The complexity of the assembly of the contact maker also does not lend itself to a cost-effective production in this case.

An additional shortcoming of the contact maker for disc cells according to FIG. 1, and power semiconductor modules according to FIG. 2, is that the spring arm, i.e., the lateral expanse between the retaining means 964, 912 and the contact location, i.e., gate terminal 610 of power semiconductor component 600, is very large. This design of elastic wire elements 962, 914 impacts contact reliability, as the homogeneity of the spring force can be guaranteed across the production of a great number of disc cells or power semiconductor modules only with considerable effort.

Accordingly, there is a need for an improved contact maker for power semiconductor modules and disc cells that overcomes at least one of the detriments noted above.

OBJECTS AND SUMMARY OF THE INVENTION

An object of the present invention is to provide a contact maker of a gate terminal for power semiconductor components in disc cells and power semiconductor modules that are universally useable, enables a lasting, reliable electrical contact, and permits a simple assembly.

Another object of the present invention is to provide a contact maker design requiring a substantially reduced contact region.

Another object of the present invention is to provide a contact maker design enabling readily automated assembly techniques with a minimal cost.

The present invention relates to a contact maker for the gate terminal of power semiconductor components in disc cells and power semiconductor modules. Disposed above the power semiconductor component is a shaped member that incorporates in the region of the gate terminal a recess, and this recess, in turn, also incorporates a counter-support. The contact maker consists of a contact spring incorporating a pin-like extension at the end of the spring that contacts the gate terminal, and incorporating a connection created via a shaped metal element to a connecting cable for the external connection at the other end of the spring, and of an insulating sleeve with a contact spring disposed therein. The insulating sleeve itself has at least one locking projection, which, together with the counter-support of the shaped member, forms a snap-lock connection.

According to an embodiment of the present invention there is provided a contact maker, for contacting a gate terminal of a power semiconductor component in one of a power semiconductor module and a disc cell, having disposed in the one above the power semiconductor component a shaped member, which has a recess in the region of the gate terminal, the recess incorporating a counter-support, wherein the contact maker comprises: a contact spring having a pin-like extension at a first spring end for contacting the gate terminal, means for connecting the pin-like extension to an external connecting cable for external connection proximate a second end of the contact spring, means for insulating the contact spring from unintended electrical connection, the means for insulating including an insulating sleeve, and the insulating sleeve including at least one means for forming a snap-lock connection with the counter-support of the shaped member, whereby the contact maker enables a reduced contact region for the gate terminal.

According to another alternative embodiment of the present invention, there is provided a contact maker, wherein: the insulating sleeve is implemented as two engageable parts, and the insulating sleeve further comprising: means for snap-locking the two engageable parts together during an assembly thereof.

According to another alternative embodiment of the present invention, there is provided a contact maker, wherein: wherein the contact spring is formed as a barrel spring.

According to another alternative embodiment of the present invention, there is provided a contact maker, wherein: the means for connecting the pin-like extension includes an elongated shaped metal element, and the shaped metal element including a first plug extending into an interior region of the contact spring, and a second plug projecting relative to the first plug enabling electrical connection with a plug-type socket of the external connecting cable.

According to another alternative embodiment of the present invention, there is provided a contact maker, wherein: the shaped metal element incorporates at least one additional plug disposed perpendicularly to the first and second plugs enabling secure retainment in an interior of the insulating sleeve.

According to another alternative embodiment of the present invention, there is provided a contact maker, wherein: the second part of the insulating sleeve facing the gate terminal includes means for preventing unintended passage and separation of the contact spring away from the insulating sleeve.

According to another alternative embodiment of the present invention, there is provided a contact maker, wherein: the contact spring, the shaped metal element, and the two parts of the insulating sleeve form an assembly unit.

According to another alternative embodiment of the present invention, there is provided a contact maker, wherein: the contact spring is connected by at least one of a welded or a soldered connection to the external connecting cable.

According to another alternative embodiment of the present invention, there is provided a contact maker, wherein: the shaped member includes a metallic material, and electrically contacts a main terminal of the power semiconductor component.

According to another alternative embodiment of the present invention, there is provided a contact maker, wherein: the insulating sleeve is implemented as two engageable parts, the insulating sleeve further comprising: means for snap-locking the two engageable parts together during an assembly thereof, and wherein the contact spring is formed as a barrel spring whereby a substantially uniform spring rate urges the contact maker into the gate terminal.

According to another alternative embodiment of the present invention, there is provided a contact maker, wherein: the means for connecting the pin-like extension includes an elongated shaped metal element, the shaped metal element includes a first plug extending into an interior region of the contact spring, and the shaped metal element includes a second plug projecting distal to the first plug enabling electrical connection with a plug-type socket of the connecting cable.

According to another embodiment of the present invention, there is provided a contact system, for electrically engaging a gate terminal of a power semiconductor component having a counter-support recess proximate the gate terminal, comprising: at least spring means for enabling an elastic electrical engagement between a contact surface of the gate terminal and an external connecting member, the spring means providing an elastic urging force oriented substantially orthogonal to the contact surface, a reduced profile contact member projecting from a first gate terminal-contact-end of the spring means distal the external connecting member, means for insulating the spring means and the reduced profile contact member from unintended electrical contact with other than the contact surface and the external connecting member, and the means for insulating includes at least one means for forming a snap-lock connection with the counter-support recess proximate the gate terminal, whereby the snap-lock connection prevents an unintended electrical separation of the contact system from the contact surface during a use, wherein the reduced profile contact member and the contact system enable a size reduction of a contact region of the contact surface.

According to another embodiment of the present invention, there is provided a contact system, wherein: the means for insulating substantially bounds the spring means orthogonal to the contact surface during the use, and the means for insulating further comprises: means for preventing an unintended separation of the spring means for enabling from the means for insulating prior to the snap-lock connection, whereby the contact system enables ready automation of electrically engaging the gate terminal of the power semiconductor component.

According to another embodiment of the present invention, there is provided a contact system, wherein: the spring means for enabling an elastic electrical engagement further comprises: counter support means for maintaining an orientation of the spring means substantially orthogonal to the contact surface during the use, and the counter support means including at least a first plug member extending within a portion of the spring means, and at least a second plug member extending from and distal from the first plug member for enabling a secure electrical connection with the external connecting member, whereby the spring means is restricted from motion non-orthogonal to the contact surface and a secure electrical contact is provided with the gate terminal.

According to another embodiment of the present invention, there is provided a contact system, wherein: the counter support means incorporates at least a third plug member disposed substantially orthogonal to the first and the second plug members and aiding a secure retainment of the spring means for enabling an elastic electrical engagement in an interior of the means for insulating.

According to another embodiment of the present invention, there is provided a contact system, wherein: the means for insulating the spring means further comprises: at least two engageable parts and means for snap-locking the two engageable parts together during an assembly thereof.

According to another alternative embodiment of the present invention, there is provided a contact maker assembly unit for electrically contacting a gate terminal of a power semiconductor component in an electronic device, the gate terminal having a shaped member with a receiving recess proximate the gate terminal incorporating a counter-support geometry, the contact apparatus incorporating: a contact spring unit providing an elastic urging contact force oriented substantially orthogonal to a contact surface of the gate terminal, the contact spring unit having a contact extension at a first spring end for contacting the contact surface and a spring coil at a second barrel-spring end distal the gate terminal, the contact extension occupying a smaller contact area on the contact surface of the gate terminal than an area determined by an outer boundary of the spring coils, means for electrically connecting an external electrical connection to the second end of the contact spring unit, insulating sleeve means for electrically insulating the contact spring unit from unintended electrical connection and for enabling a snap-lock connection with the counter-support geometry, and means for preventing an unintended separation of the contact spring unit from the insulating sleeve means prior to the snap-lock connection, whereby the contact system enables ready assembly automation of electrically engaging the gate terminal of the power semiconductor component at a reduced size.

According to another alternative embodiment of the present invention, there is provided a contact maker assembly unit, wherein: the insulating sleeve means further comprises: a first and a second part, means for snap-locking the first and second parts together during an assembly, and the means for preventing an unintended separation includes a bounded opening surrounding the contact extension on one of the first and second parts.

According to another alternative embodiment of the present invention, there is provided a contact maker assembly unit, wherein: the means for electrically connecting an external electrical connection further comprises: an elongated shaped metal element, and the elongated shaped metal element including a first plug portion extending into and contacting an interior region of the spring coil at the second barrel-spring end, and a second plug portion projecting relative to the first plug portion for enabling electrical connection with the external electrical connecting.

According to another alternative embodiment of the present invention, there is provided a contact maker assembly unit, wherein: the elongated shaped metal element incorporates at least one additional plug portion disposed perpendicularly to the first and second plug portions enabling secure retainment in an interior of the insulating sleeve means.

The above, and other objects, features and advantages of the present invention will become apparent from the following description read in conduction with the accompanying drawings, in which like reference numerals designate the same elements.

DETAILED DESCRIPTION OF A PREFERRED EMBODIMENTS

Figure 1:
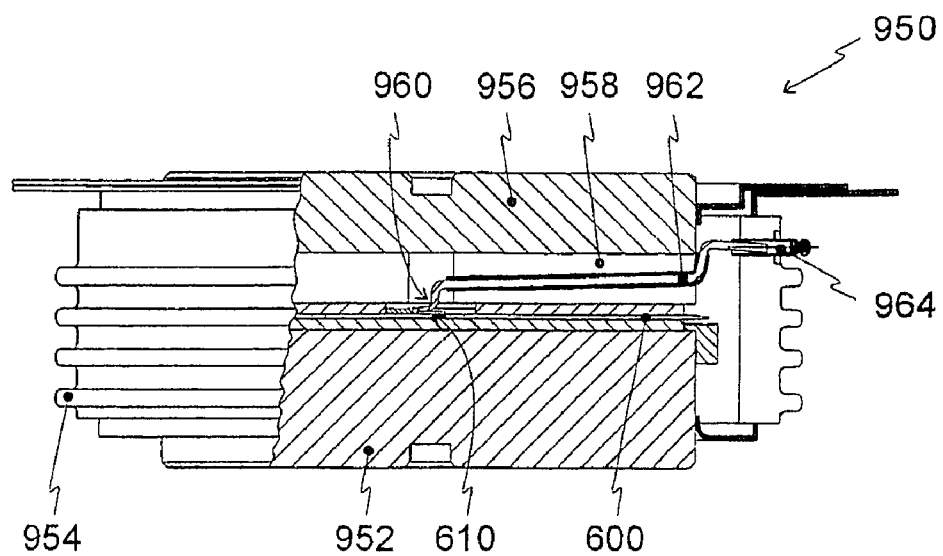
FIG. 1 provides a conventional disc cell.

Reference will now be made in detail to several embodiments of the invention that are illustrated in the accompanying drawings. Wherever possible, same or similar reference numerals are used in the drawings and the description to refer to the same or like parts or steps. The drawings are in simplified form and are not to precise scale or shape. For purposes of convenience and clarity only, directional terms, such as top, bottom, up, down, over, above, and below may be used with respect to the drawings. These and similar directional terms should not be construed to limit the scope of the invention in any manner. Furthermore, the words "connect," "couple," and similar terms with their inflectional morphemes do not necessarily denote direct and immediate connections, but also include connections through mediate elements or devices.

As noted above, the present invention is based on the initial object of presenting a contact maker of the gate terminal of power semiconductor components in disc cells and power semiconductor modules that is universally useable, ensures a lasting, reliable electrical contact, and permits a simple assembly.

The basic idea of the invention takes as its starting point a power semiconductor module that is preferably in pressure-contact with one or more semiconductor components or a disc cell. A disc cell typically has disposed in it only one power semiconductor component, but special designs exist that have a plurality of power semiconductor components in one housing.

The invention relates to power semiconductor modules or disc cells having at least one actuated power semiconductor component, such as a thyristor or transistor. These have a gate terminal that is actuated from outside the power semiconductor module or disc cell by means of a control signal.

The semiconductor components in power semiconductor modules and disc cells are often connected on both sides, in each case, to a flat metal member, the thermal expansion coefficient of which lies between the thermal expansion coefficient of the semiconductor component and the thermal expansion coefficient of a downstream contact maker of the power terminals so as to reduce the thermal stress for the semiconductor component. The connection of the semiconductor component to the flat metal members, which preferably consist of molybdenum, may be achieved by different methods, for example by means of soldering, gluing or pressure-contacting of the two partners. The flat metal member typically has a thickness in the range of a few tenths of a millimeter to several millimeters.

The inventive contact maker for contacting the gate terminal of the at least one power semiconductor component has associated to it, on the main surface carrying the main terminal and gate terminal, a shaped member, for example the above-mentioned flat metal member. This shaped member has, in the region above the gate terminal, a recess, and this recess, in turn, incorporates a counter-support.

The contact maker itself preferably includes a contact spring having a pin-like extension at the end of the spring that contacts the gate terminal. Additionally, it has a connection, created either directly or via a shaped metal element, to a connecting cable for the external connection at the other end of the spring. The contact spring and the optional shaped metal element are arranged in an insulating sleeve, said insulating sleeve having at least one locking projection forming a snap-lock connection together with the counter-support of the shaped member.

Figure 3:
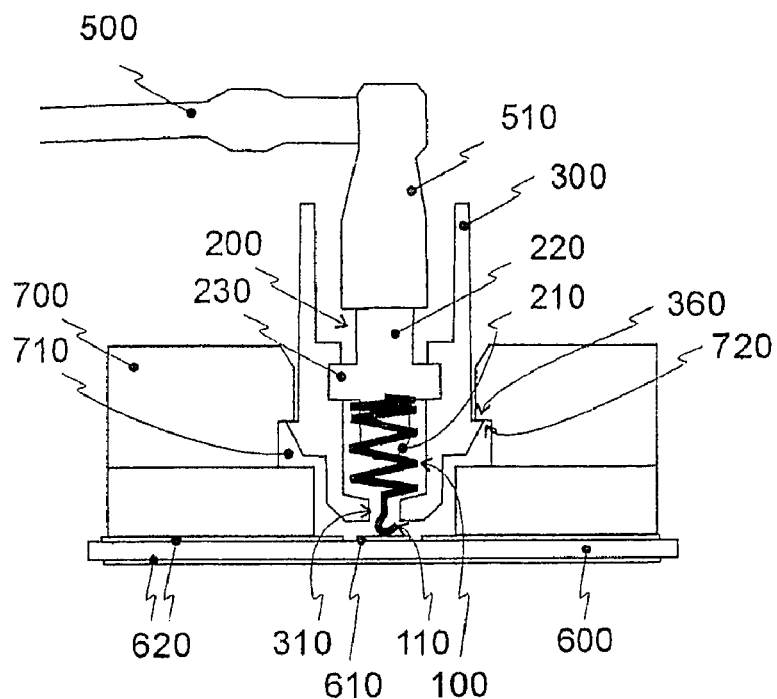
FIG. 3 is one embodiment of an inventive contact maker in a power semiconductor module.

Referring now to FIG. 3, according to one embodiment of the present invention, an inventive contact maker in a power semiconductor module is provided. Depicted is a portion of a power semiconductor component 600 with a gate terminal 610 centrally disposed on its first main surface, as well as a first and second power terminal 620 disposed on the two opposed main surfaces of the power semiconductor components 600. Arranged above the first main surface of power semiconductor component 600 is a shaped metallic member 700 formed from the sandwich of two shaped partial members. Shaped member 700 has a round central recess 710 having an edge 720.

The contact maker itself consists of an insulating sleeve shown as sleeve 300 comprising a thermal or preferably duroplastic plastic, a spring element 100, and a shaped metal element 200 shaped as a connector plug. Sleeve 300 serves to provide the electrical isolation of the control signal from the power terminal, which is formed by shaped metallic member 700.

Sleeve 300 has locking projections 360. Locking projections 360 project outwardly, and together with edges 720 of shaped metallic member 700, form a snap-lock connection, with edges 720 serving as counter-support. This provides for a simple assembly of the contact maker into shaped metallic member 700.

Disposed in the interior of plastic sleeve 300 is contact spring 100, which is implemented as a barrel spring. Contact spring 100 has on its side facing power semiconductor component 600, a reduced profile pin-like extension 110 arranged centrally to the spring axis, with an end of different shape. Extension 110 may, for example, be implemented as a blunt, ball-like, or in the form of an arc or angular member, as shown. Extension 110 penetrates through sleeve 300, the latter being designed such that spring element 100 is secured against falling out in the direction of gate terminal 610. Extension 110 serves to contact gate terminal 610 of power semiconductor component 600. The elastic section of contact spring 100 serves to apply the pressure, which is constant over the life of the disc cell or power semiconductor module, and thus ensure the reliable contacting of gate terminal 610 with a substantially uniform spring force.

Shaped metal element 200, which is also disposed in the interior of sleeve 300, serves for the electrical connection of contact spring 100 to the external gate terminal of the disc cell or power semiconductor component. For this purpose shaped metal element 200 has a first plug 210 that serves to guide the shaped metal element 200 and extends into the interior region of the contact spring 100. Additional plugs 230 are disposed at angles to first plug 210, which form an end-stop for the contact spring 100 and thus serve to establish the pressure.

To connect to a connecting cable 500, which has a socket 510, shaped metal element 200 has a second plug 220, which is implemented as a connector plug. This creates the connection to an external power supply.

An alternative and more cost-effective design of the contact maker provides for the plastic sleeve 300 to be designed such that the plastic sleeve itself has a counter-support mechanism for the spring element and the end of the spring that faces away from the power semiconductor component is connected directly to the connecting cable 500 by means of a soldered or welded connection.

Figure 4:
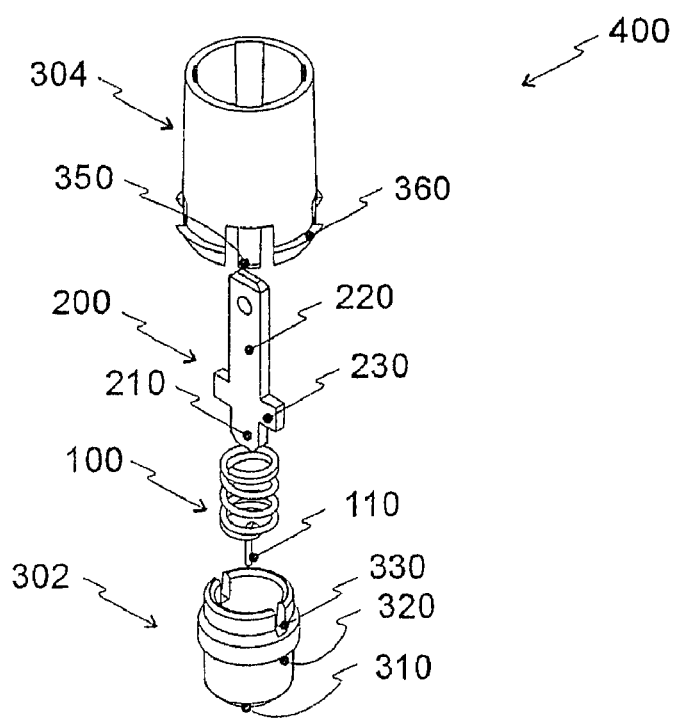
FIG. 4 is a perspective exploded view of an inventive contact maker as in FIG. 3.

Referring now to FIG. 4, a three-dimensional exploded view of an inventive contact maker 400 is provided. Depicted here are sleeve 300, contact spring 100, and shaped metal element 200. Sleeve 300 in this case is implemented as two parts. A first partial sleeve 302 forms the part of the plastic sleeve 300 that faces power semiconductor component 600. First partial sleeve 302 is implemented such that contact spring 100, which is provided with a blunt end, is secured in the direction of gate terminal 610 against falling out, and has for this purpose a recess 310 that is approximately 0.2 mm larger than the diameter of any pin-like extension 110 of contact spring 100. Additionally, first partial sleeve 302 has a locking edge 320, as well as two recesses 330 at the upper edge whose functions will be described below.

Figure 2:
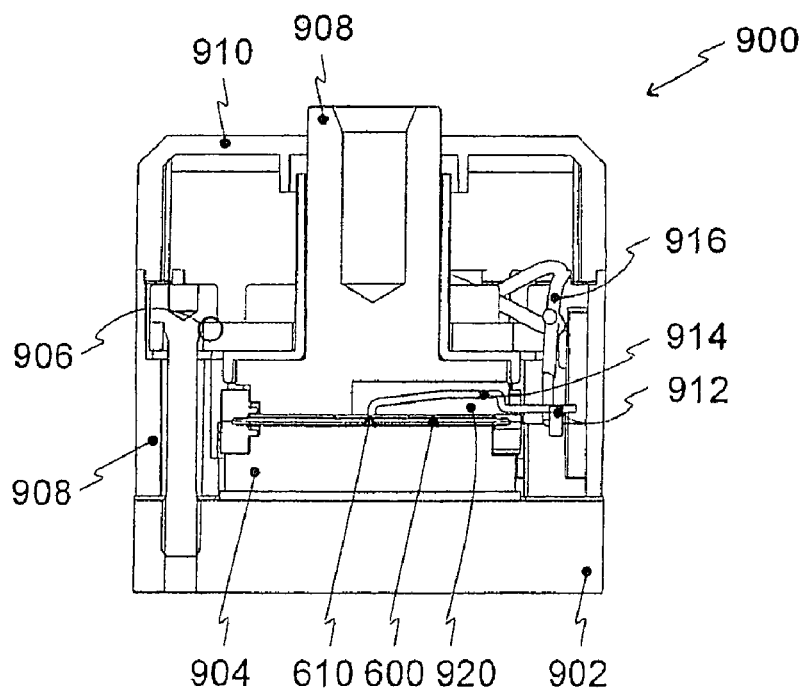
FIG. 2 is a cross-sectional view of a conventional pressure-contacted power semiconductor module.

Also shown is the second part of sleeve 300 as a second partial sleeve 304 with four locking projections 360 being arranged facing outwardly, for the snap-lock connection to the shaped metallic part (see for example FIG. 2, 700) on its associated counter-support (compare to FIG. 2, 710). Additionally, second partial sleeve 304 has four additional locking projections 350, whose projections are arranged facing inwardly and which find their counter-support in locking edge 320 of first partial sleeve 302. By means of this second snap-lock connection the two partial sleeves 302, 304 are secured to one another.

In the process of said securing of the two partial sleeves 302, 304 to form one plastic sleeve 300, additionally both the contact spring 100, as well as previously described shaped metal element 200, are secured in the interior of plastic sleeve 300. Recesses 330 at the upper edge of first partial sleeve 302 serve this securing purpose. Arranged in first partial sleeve 302 is contact spring 100 in such a way that pin-like extension 110 extends through lower recess 310 and thus secures contact spring 100 toward the bottom.

At the upper end of the spring, shaped metal element 200 projects with a first plug 210 into the interior of the contact spring 100. The two additional plugs 230 are implemented at right angles to first plug 210 and arranged in recesses 330 of first partial sleeve 302 and secured there by the joining of the two partial sleeves 302, 304. This assembly results in an assembly unit formed of contact spring 100, shaped metal element 200, and the two parts 302, 304 of the plastic sleeve 300.

Figure 5:
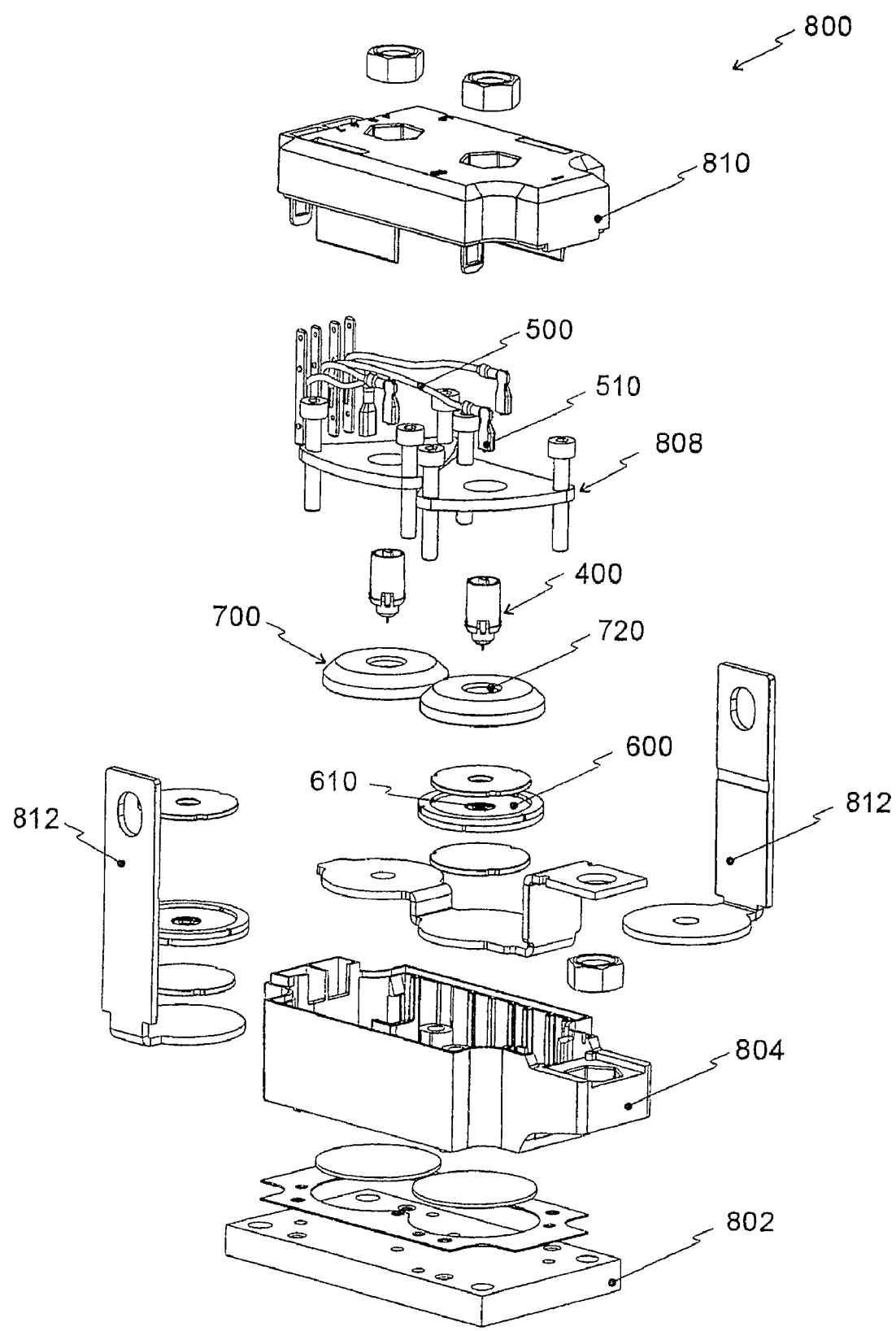
FIG. 5 is a perspective exploded view of a power semiconductor module with an inventive contact maker.

Referring now to FIG. 5, a three-dimensional exploded view of a power semiconductor module 800 with inventive contact maker 400 is provided. Depicted is a power semiconductor module 800 with two thyristors 600 built in pressure-contact technology. Disposed on a base plate 802 in a suitable manner are:

- insulation material for the electrical isolation of the electricity-carrying components of the power semiconductor module 800 from main plate 802;
- two thyristors 600 with suitable electrical connecting elements 812;
- two shaped members 700 to receive the contact maker and apply the pressure;
- a pressure-type contact maker 808 (comparable to the one described in FIG. 2) and
- a housing 804 with cover 810.

Inventive contact maker 400 in this case is an assembly unit in the assembly of the power semiconductor module 800. Respective contact makers 400 are inserted for this purpose into the associated shaped members 700 and snap in on their locking edges 720. Shaped members 700 are formed preferably of a duroplastic plastic, since they only serve to apply pressure via the pressure-type contact maker 808, but not to provide the electrical connection, since load connectors 812 are implemented here as metallic terminal plates. The electrical connection between contact maker 400 to the outside is again created by means of a cable 500 with a socket 510 connected thereto. Socket 510 is arranged for this purpose on second plug 220, (compare to FIG. 3), which is implemented as a connector plug of contact maker 400.

While the use of ceramic, metallic, duroplastic plastic and other materials are preferably discussed herein those of skill in the art will recognize that materials selection is a function of the desired result. As a consequence, those materials discussed herein may be modified, or substituted for, in a manner that allows the desired result discussed herein without departing from the scope and spirit of the present invention.

In the claims, means- or step-plus-function clauses are intended to cover the structures described or suggested herein as performing the recited function and not only structural equivalents but also equivalent structures. Thus, for example, although a nail, a screw, and a bolt may not be structural equivalents in that a nail relies on friction between a wooden part and a cylindrical surface, a screw's helical surface positively engages the wooden part, and a bolt's head and nut compress opposite sides of a wooden part, in the environment of fastening wooden parts, a nail, a screw, and a bolt may be readily understood by those skilled in the art as equivalent structures.

Having described at least one of the preferred embodiments of the present invention with reference to the accompanying drawings, it is to be understood that the invention is not limited to those precise embodiments, and that various changes, modifications, and adaptations may be effected therein by one skilled in the art without departing from the scope or spirit of the invention as defined in the appended claims.

What is claimed is:

1. A contact maker, for contacting a gate terminal of a power semiconductor component in one of a power semiconductor module and a disc cell, having disposed in said one above the power semiconductor component a shaped member, which has a recess in the region of the gate terminal, the recess incorporating a counter-support, wherein the contact maker comprises:
   - a contact spring having a pin shaped extension at a first spring end for contacting the gate terminal;
   - means for connecting the pin shaped extension to an external connecting cable for external connection proximate a second end of the contact spring;
   - means for insulating the contact spring from unintended electrical connection, said means for insulating including an insulating sleeve; and
   - the insulating sleeve including at least one means for forming a snap-lock connection with the counter-support of the shaped member, wherein said contact maker enables a reduced contact region for said gate terminal.

2. A contact maker, according to claim 1, wherein:
   - the insulating sleeve is implemented as two engageable parts; and
   - the insulating sleeve further comprising:
     - means for snap-locking said two engageable parts together during an assembly thereof.

3. A contact maker, according to claim 1, wherein:
   - wherein the contact spring is formed as a barrel spring.

4. A contact maker according to claims 2, wherein:
   - said means for connecting the pin shaped extension includes an elongated shaped metal element; and
   - the shaped metal element including a first plug extending into an interior region of the contact spring, and a second plug projecting relative to said first plug enabling electrical connection with a plug-type socket of the external connecting cable.

5. A contact maker, according to claim 4, wherein:
   - the shaped metal element incorporates at least one additional plug disposed perpendicularly to said first and second plugs enabling secure retainment in an interior of the insulating sleeve.

6. A contact maker, according to claim 2, wherein:
   - the second part of the insulating sleeve facing the gate terminal includes means for preventing unintended passage and separation of the contact spring away from the insulating sleeve.

7. A contact maker, according to claim 5, wherein:
   - the contact spring, the shaped metal element, and the two parts of the insulating sleeve form an assembly unit.

8. A contact maker, according to claim 3, wherein:
   - the contact spring is connected by at least one of a welded or a soldered connection to the external connecting cable.

9. A contact maker, according to claim 1, wherein:
   - the shaped member includes a metallic material, and electrically contacts a main terminal of the power semiconductor component.

10. A contact maker, according to claim 1, wherein:
    - the insulating sleeve is implemented as two engageable parts;
    - the insulating sleeve further comprising:
      - means for snap-locking said two engageable parts together during an assembly thereof; and
    - wherein the contact spring is formed as a barrel spring whereby a substantially uniform spring rate urges said contact maker into said gate terminal.

11. A contact maker, according to claim 1, wherein:
    - said means for connecting the pin shaped extension includes an elongated shaped metal element;
    - the shaped metal element includes a first plug extending into an interior region of the contact spring; and
    - the shaped metal element includes a second plug projecting distal to said first plug enabling electrical connection with a plug-type socket of the connecting cable.

12. A contact system, for electrically engaging a gate terminal of a power semiconductor component having a counter-support recess proximate said gate terminal, comprising:
- at least spring means for enabling an elastic electrical engagement between a contact surface of said gate terminal and an external connecting member;
- said spring means providing an elastic urging force oriented substantially orthogonal to said contact surface;
- a reduced profile contact member projecting from a first gate terminal-contact-end of said spring means distal said external connecting member;
- means for insulating said spring means and said reduced profile contact member from unintended electrical contact with other than said contact surface and said external connecting member; and
- said means for insulating includes at least one means for forming a snap-lock connection with said counter-support recess proximate said gate terminal, whereby said snap-lock connection prevents an unintended electrical separation of said contact system from said contact surface during a use, wherein said reduced profile contact member and said contact system enable a size reduction of a contact region of said contact surface.

13. A contact system, according to claim 12, wherein:
said means for insulating substantially bounds said spring means orthogonal to said contact surface during said use; and
said means for insulating further comprises:
- means for preventing an unintended separation of said spring means for enabling from said means for insulating prior to said snap-lock connection, whereby said contact system enables ready automation of electrically engaging said gate terminal of said power semiconductor component.

14. A contact system, according to claim 13, wherein:
said spring means for enabling an elastic electrical engagement further comprises:
- counter support means for maintaining an orientation of said spring means substantially orthogonal to said contact surface during said use; and
- said counter support means including at least a first plug member extending within a portion of said spring means, and at least a second plug member extending from and distal from said first plug member for enabling a secure electrical connection with said external connecting member, whereby said spring means is restricted from motion non-orthogonal to said contact surface and a secure electrical contact is provided with said gate terminal.

15. A contact system, according to claim 14, wherein:
said counter support means incorporates at least a third plug member disposed substantially orthogonal to said first and said second plug members and aiding a secure retainment of said spring means for enabling an elastic electrical engagement in an interior of said means for insulating.

16. A contact system, according to claim 15, wherein:
said means for insulating said spring means further comprises:
- at least two engageable parts and means for snap-locking said two engageable parts together during an assembly thereof.

17. A contact maker assembly unit for electrically contacting a gate terminal of a power semiconductor component in an electronic device, said gate terminal having a shaped member with a receiving recess proximate said gate terminal incorporating a counter-support geometry, said contact apparatus incorporating:
- a contact spring unit providing an elastic urging contact force oriented substantially orthogonal to a contact surface of said gate terminal;
- said contact spring unit having a contact extension at a first spring end for contacting said contact surface and a spring coil at a second barrel-spring end distal said gate terminal;
- said contact extension occupying a smaller contact area on said contact surface of said gate terminal than an area determined by an outer boundary of said spring coils;
- means for electrically connecting an external electrical connection to said second end of said contact spring unit;
- insulating sleeve means for electrically insulating said contact spring unit from unintended electrical connection and for enabling a snap-lock connection with said counter-support geometry; and
- means for preventing an unintended separation of said contact spring unit from said insulating sleeve means prior to said snap-lock connection, whereby said contact system enables ready assembly automation of electrically engaging said gate terminal of said power semiconductor component at a reduced size.

18. A contact maker assembly unit, according to claim 17, wherein:
said insulating sleeve means further comprises:
- a first and a second part;
- means for snap-locking said first and second parts together during an, assembly; and
- said means for preventing an unintended separation includes a bounded opening surrounding said contact extension on one of said first and second parts.

19. A contact maker assembly unit, according to claim 18, wherein:
said means for electrically connecting an external electrical connection further comprises:
- an elongated shaped metal element; and
- said elongated shaped metal element including a first plug portion extending into and contacting an interior region of said spring coil at said second barrel-spring end, and a second plug portion projecting relative to said first plug portion for enabling electrical connection with said external electrical connecting.

20. A contact maker assembly unit, according to claim 19, wherein:
said elongated shaped metal element incorporates at least one additional plug portion disposed perpendicularly to said first and second plug portions enabling secure retainment in an interior of said insulating sleeve means.

* * * * *